United States Patent
Kim

(10) Patent No.: US 11,252,364 B2
(45) Date of Patent: Feb. 15, 2022

(54) IMAGE SENSING DEVICE GENERATING RAMP VOLTAGE WITH COARSE RAMP CURRENT AND FINE RAMP CURRENT FOR SINGLE RAMP PERIOD

(71) Applicant: SK hynix Inc., Gyeonggi-do (KR)

(72) Inventor: Tae-Gyu Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 253 days.

(21) Appl. No.: 16/186,407

(22) Filed: Nov. 9, 2018

(65) Prior Publication Data
US 2019/0281246 A1 Sep. 12, 2019

(30) Foreign Application Priority Data
Mar. 8, 2018 (KR) .......................... 10-2018-0027405

(51) Int. Cl.
*H04N 5/376* (2011.01)
*H03K 4/02* (2006.01)
*H04N 5/369* (2011.01)
*H04N 5/378* (2011.01)
*H03M 1/56* (2006.01)
*H04N 5/374* (2011.01)
*H04N 5/3745* (2011.01)

(52) U.S. Cl.
CPC ........... *H04N 5/3765* (2013.01); *H03K 4/026* (2013.01); *H04N 5/3692* (2013.01); *H04N 5/3698* (2013.01); *H04N 5/374* (2013.01); *H04N 5/378* (2013.01); *H04N 5/37455* (2013.01); *H03M 1/56* (2013.01)

(58) Field of Classification Search
CPC .... H04N 5/3765; H04N 5/3698; H04N 5/378; H04N 5/374–37455; H04N 5/3355; H03K 4/026; H03M 1/56; H03M 1/00–645; H03M 1/66–88
USPC .................................................. 341/144–172
See application file for complete search history.

(56) References Cited

U.S. PATENT DOCUMENTS 6,177,901 B1 * 1/2001 Pan .......................... H03M 1/56
341/155
7,423,570 B2 * 9/2008 Asayama ................ H03M 1/66
341/144
(Continued)

FOREIGN PATENT DOCUMENTS

CN      102244742 A      11/2011
CN      102572325 A      7/2012
(Continued)

OTHER PUBLICATIONS

Office Action issued by the Chinese Patent Office dated Jan. 28, 2021.

*Primary Examiner* — Twyler L Haskins
*Assistant Examiner* — Akshay Trehan
(74) *Attorney, Agent, or Firm* — IP & T Group LLP

(57) ABSTRACT

An image sensing device includes a coarse current generation circuit suitable for generating a coarse ramp current adjusted to a coarse level for a single ramp period, a fine current generation circuit suitable for generating a fine ramp current adjusted to a fine level for the single ramp period, and a current-to-voltage conversion circuit suitable for generating a ramp voltage corresponding to a resultant current of the coarse ramp current and the fine ramp current for the single ramp period.

20 Claims, 4 Drawing Sheets

(56) References Cited

U.S. PATENT DOCUMENTS

| | | | | |
|---|---|---|---|---|
| 8,723,998 B2* | 5/2014 | Maruta | ......... | H04N 5/378 |
| | | | | 348/294 |
| 9,525,836 B2* | 12/2016 | Hashimoto | ......... | H04N 5/378 |
| 9,641,779 B2* | 5/2017 | Aibara | ......... | H04N 5/351 |
| 2010/0208112 A1* | 8/2010 | Lim | ......... | G11C 7/106 |
| | | | | 348/294 |
| 2011/0001039 A1* | 1/2011 | Hoshino | ......... | H04N 5/3742 |
| | | | | 250/208.1 |
| 2011/0114827 A1* | 5/2011 | Yamaoka | ......... | H03K 7/08 |
| | | | | 250/214 R |
| 2011/0279723 A1* | 11/2011 | Takamiya | ......... | H04N 5/3745 |
| | | | | 348/308 |
| 2011/0292261 A1* | 12/2011 | Hwang | ......... | H04N 5/378 |
| | | | | 348/294 |
| 2012/0008028 A1* | 1/2012 | Egawa | ......... | H04N 5/378 |
| | | | | 348/300 |
| 2013/0229293 A1* | 9/2013 | Standley | ......... | H03M 1/002 |
| | | | | 341/122 |
| 2014/0014815 A1* | 1/2014 | Lee | ......... | H04N 5/378 |
| | | | | 250/208.1 |
| 2014/0375858 A1* | 12/2014 | Lee | ......... | H03K 4/026 |
| | | | | 348/308 |
| 2015/0009386 A1* | 1/2015 | Komaba | ......... | H04N 5/369 |
| | | | | 348/308 |
| 2015/0350585 A1* | 12/2015 | Kim | ......... | H03M 1/1014 |
| | | | | 348/308 |
| 2018/0205897 A1* | 7/2018 | Kim | ......... | H04N 5/3575 |
| 2019/0208152 A1* | 7/2019 | Tanaka | ......... | H04N 5/37455 |

FOREIGN PATENT DOCUMENTS

| | | |
|---|---|---|
| CN | 102883117 A | 1/2013 |
| KR | 1020140010718 | 1/2014 |
| KR | 101557316 | 10/2015 |

* cited by examiner

IMAGE SENSING DEVICE GENERATING RAMP VOLTAGE WITH COARSE RAMP CURRENT AND FINE RAMP CURRENT FOR SINGLE RAMP PERIOD

CROSS-REFERENCE TO RELATED APPLICATION

This application claims priority under 35 U.S.C. § 119 to Korean Patent Application No. 10-2018-0027405, filed on Mar. 8, 2018, in the Korean Intellectual Property Office, the disclosure of which is incorporated herein by reference in its entirety.

BACKGROUND

1. Field

Various embodiments of the present invention relate to a semiconductor design technique, and more particularly, to an image sensing device.

2. Description of the Related Art

Generally, image sensing devices capture images using photosensitive properties of semiconductors. Image sensing devices are often classified into charge-coupled device (CCD) image sensors and complementary metal-oxide semiconductor (CMOS) image sensors. CMOS image sensors allow both analog and digital control circuits to be integrated in a single integrated circuit (IC), making CMOS image sensors the most widely used type of image sensor.

SUMMARY

Various embodiments of the present invention are directed to an image sensing device including a ramp voltage generator having an optimized circuit structure.

In accordance with an embodiment of the present invention, an image sensing device includes: a coarse current generation circuit suitable for generating a coarse ramp current adjusted to a coarse level for a single ramp period; a fine current generation circuit suitable for generating a fine ramp current adjusted to a fine level for the single ramp period; and a current-to-voltage conversion circuit suitable for generating a ramp voltage corresponding to a resultant current of the coarse ramp current and the fine ramp current for the single ramp period.

The coarse current generation circuit may be coupled between a supply terminal of a high voltage and an output terminal of the ramp voltage. The fine current generation circuit may be coupled between at least one of the supply terminal of the high voltage and a supply terminal of a low voltage and the output terminal of the ramp voltage. The current-to-voltage conversion circuit may be coupled between the output terminal of the ramp voltage and the supply terminal of the low voltage.

The coarse ramp current may correspond to a plurality of coarse unit currents which are sourced to the output terminal of the ramp voltage for the single ramp period. The plurality of coarse unit currents may be simultaneously sourced to the output terminal of the ramp voltage, and then are sequentially blocked for the single ramp period.

The fine ramp current may correspond to a plurality of first fine unit currents which are sourced to the output terminal of the ramp voltage for a first ramp period of the single ramp period and a plurality of second fine unit currents which sink from the output terminal of the ramp voltage for a second ramp period of the single ramp period. The plurality of first fine unit currents may be simultaneously sourced to the output terminal of the ramp voltage, and then are sequentially blocked for the first ramp period. The plurality of second fine unit currents may sequentially sink from the output terminal of the ramp voltage for the second ramp period.

The first and second ramp periods may be repeated two or more times for the single ramp period.

In accordance with another embodiment of the present invention, an image sensing device includes: a plurality of first current cells coupled between a supply terminal of a high voltage and an output terminal of a ramp voltage, and suitable for sourcing coarse unit currents to the output terminal of the ramp voltage based on an enable signal and a plurality of first control signals for a single ramp period; a plurality of second current cells coupled between the supply terminal of the high voltage and the output terminal of the ramp voltage, and suitable for sourcing fine unit currents to the output terminal of the ramp voltage based on the enable signal and a plurality of second control signals for the single ramp period; and a load coupled between the output terminal of the ramp voltage and a supply terminal of a low voltage.

Each of the first current cells may include: A first current source suitable for generating the coarse unit currents; and a first switch suitable for switching between the first current source and the output terminal of the ramp voltage based on a corresponding first control signal among the plurality of first control signals.

Each of the second current cells may include: a second current source suitable for generating the fine unit currents; and a second switch suitable for switching between the second current source and the output terminal of the ramp voltage based on a corresponding second control signal among the plurality of second control signals and the enable signal.

The image sensing device may further include: a plurality of third current cells coupled between the output terminal of the ramp voltage and the supply terminal of the low voltage, and suitable for sinking the fine unit currents from the output terminal of the ramp voltage based on the enable signal and a plurality of third control signals for the single ramp period.

Each of the third current cells may include: a third current source suitable for generating the fine unit currents; and a third switch suitable for switching between the third current source and the output terminal of the ramp voltage based on a corresponding third control signal among the plurality of third control signals and the enable signal.

The image sensing device may further include: a first reference cell coupled between the supply terminal of the high voltage and the output terminal of the ramp voltage, and suitable for sourcing the fine unit currents to the output terminal of the ramp voltage based on the enable signal for a first ramp period of the single ramp period; and a second reference cell coupled between the output terminal of the ramp voltage and the supply terminal of the low voltage, and suitable for sinking the fine unit currents from the output terminal of the ramp voltage based on the enable signal for a second ramp period of the single ramp period.

The first and second ramp periods may be repeated two or more times for the single ramp period.

The load may include a resistor.

In accordance with yet another embodiment of the present invention, an image sensing device includes: a pixel array suitable for generating pixel signals; an analog-to-digital converter suitable for generating image signals corresponding to the pixel signals based on a ramp voltage; and a ramp voltage generator suitable for generating the ramp voltage based on a resultant current of a coarse ramp current adjusted to a coarse level and a fine ramp current adjusted to a fine level for a single ramp period.

The ramp voltage generator may include: a coarse current generation circuit suitable for generating the coarse ramp current for the single ramp period; a fine current generation circuit suitable for generating the fine ramp current for the single ramp period; and a current-to-voltage conversion circuit suitable for generating the ramp voltage corresponding to the resultant current for the single ramp period.

The coarse current generation circuit may include a plurality of first current cells coupled between a supply terminal of a high voltage and an output terminal of the ramp voltage. The plurality of first current cells may source coarse unit currents to the output terminal of the ramp voltage based on an enable signal and a plurality of first control signals for the single ramp period.

The fine current generation circuit may include a plurality of second current cells coupled between a supply terminal of a high voltage and an output terminal of the ramp voltage. The plurality of second current cells may source first fine unit currents to the output terminal of the ramp voltage based on an enable signal and a plurality of second control signals for the single ramp period.

The fine current generation circuit may further include a plurality of third current cells coupled between the output terminal of the ramp voltage and a supply terminal of a low voltage. The plurality of third current cells may sink second fine unit currents from the output terminal of the ramp voltage based on the enable signal and a plurality of third control signals for the single ramp period.

The fine current generation circuit may further include: a first reference cell coupled between the supply terminal of the high voltage and the output terminal of the ramp voltage, and suitable for sourcing the fine unit currents to the output terminal of the ramp voltage based on the enable signal for a first ramp period of the single ramp period; and a second reference cell coupled between the output terminal of the ramp voltage and the supply terminal of the low voltage, and suitable for sinking the second fine unit currents from the output terminal of the ramp voltage based on the enable signal for a second ramp period of the single ramp period.

The first and second ramp periods may be repeated two or more times for the single ramp period.

DETAILED DESCRIPTION

Various embodiments of the present invention will be described below in more detail with reference to the accompanying drawings. These embodiments are provided so that this disclosure is thorough and complete. All "embodiments" referred to in this disclosure are directed to aspects of the present invention. The embodiments are not intended to limit the scope of the invention. Also, throughout the specification, reference to "an embodiment," "another embodiment," or the like is not necessarily to the same embodiment, and different references to any such phrase are not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to identify various elements, these elements are not limited by these terms. These terms are used to distinguish one element from another element that otherwise have the same or similar names. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
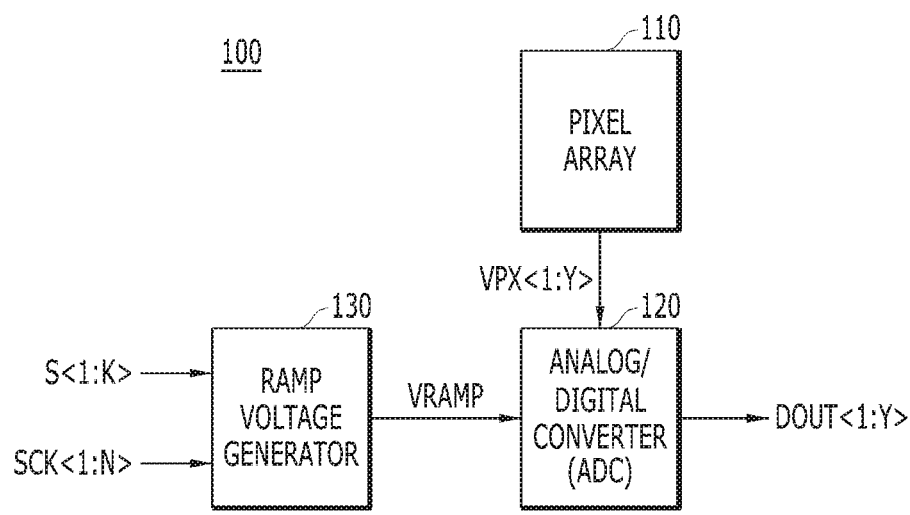
FIG. 1 is a block diagram illustrating an image sensing device in accordance with an embodiment of the present invention.

FIG. 1 is a block diagram illustrating an image sensing device 100 in accordance with an embodiment of the present invention.

Referring to FIG. 1, the image sensing device 100 may include a pixel array 110, an analog-to-digital converter (ADC) 120, and a ramp voltage generator 130.

The pixel array 110 may include X*Y pixels (not illustrated) arranged in X rows and Y columns, or vice versa. Herein, "X" and "Y" are natural numbers equal to or different from each other. The pixel array 110 may sequentially output first to $Y^{th}$ pixel signals VPX<1:Y> in units of rows X times. For example, the pixel array 110 may output the first to $Y^{th}$ pixel signals VPX<1:Y> from pixels arranged in each of rows for each single row period. Each of the first to $Y^{th}$ pixel signals VPX<1:Y> may be an analog signal.

The ADC 120 may generate first to $Y^{th}$ image signals DOUT<1:Y> corresponding to the first to $Y^{th}$ pixel signals VPX<1:Y> based on a ramp voltage VRAMP. Each of the first to $Y^{th}$ image signals DOUT<1:Y> may be a digital signal.

The ramp voltage generator 130 may generate the ramp voltage VRAMP based on a resultant current of a coarse ramp current which is adjusted to a coarse level and a fine ramp current which is adjusted to a fine level for a single ramp period. The coarse ramp current is based on first to $K^{th}$ coarse control signals S<1:K>, and the fine ramp current is based on first to $N^{th}$ fine control signals SCK<1:N>. The single ramp period may correspond to the singe row period. In other words, the ramp voltage generator 130 may repeatedly generate the ramp voltage VRAMP for each single ramp period.

Figure 2:
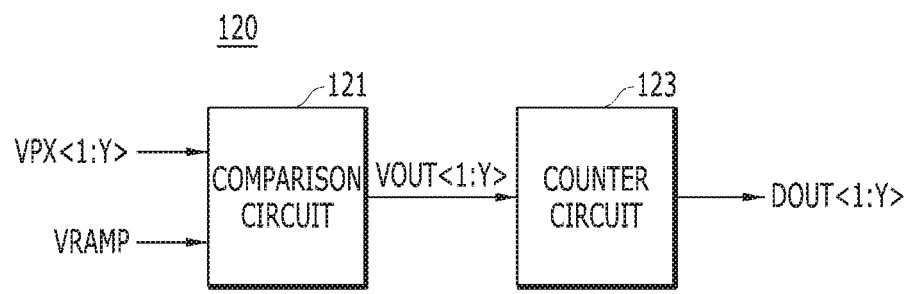
FIG. 2 is a block diagram illustrating an analog-to-digital converter in accordance with an embodiment of the present invention.

FIG. 2 is a block diagram illustrating an analog-to-digital converter in accordance with an embodiment of the present invention, for example, the analog-to-digital converter (ADC) 120 shown in FIG. 1.

Referring to FIG. 2, the ADC 120 may include a comparison circuit 121 and a counter circuit 123.

The comparison circuit 121 may include first to $Y^{th}$ comparison blocks (not illustrated) corresponding to the first to $Y^{th}$ pixel signals VPX<1:Y>. The first to $Y^{th}$ comparison blocks may receive corresponding pixel signals among the first to $Y^{th}$ pixel signals VPX<1:Y>, respectively, and receive the ramp voltage VRAMP in common. Each of the first to $Y^{th}$ comparison blocks may compare each of the corresponding pixel signals with the ramp voltage VRAMP, and generate first to $Y^{th}$ comparison result signals VOUT<1:Y> based on a result of the comparison.

The counter circuit 123 may include first to $Y^{th}$ counting blocks (not illustrated) corresponding to the first to $Y^{th}$ comparison result signals VOUT<1:Y>. The first to $Y^{th}$ counting blocks may count the first to $Y^{th}$ comparison result signals VOUT<1:Y>, respectively, and generate the first to $Y^{th}$ image signals DOUT<1:Y> based on a result of the counting.

Figure 3:
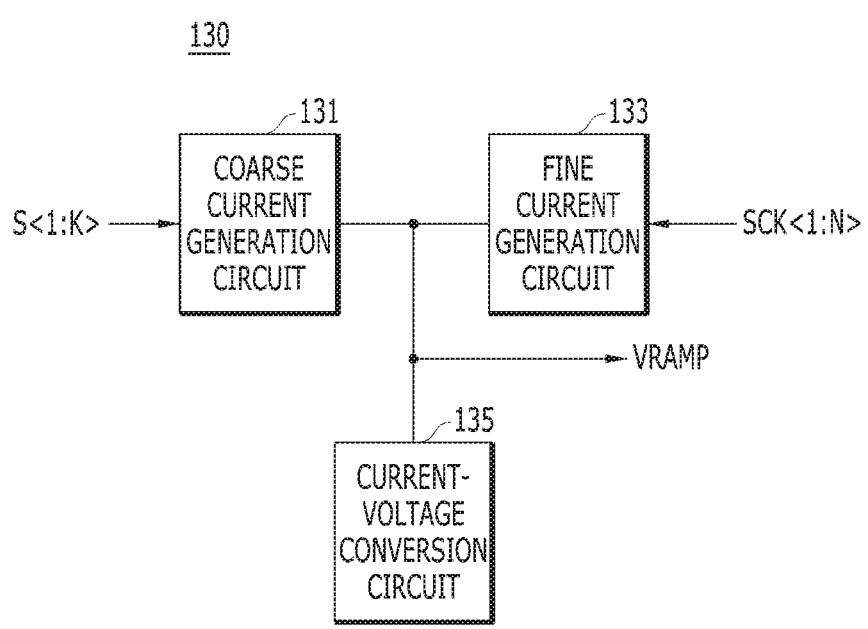
FIG. 3 is a block diagram illustrating a ramp voltage generator in accordance with an embodiment of the present invention.

FIG. 3 is a block diagram illustrating a ramp voltage generator in accordance with an embodiment of the present invention, for example, the ramp voltage generator 130 shown in FIG. 1.

Referring to FIG. 3, the ramp voltage generator 130 may include a coarse current generation circuit 131, a fine current generation circuit 133, and a current-to-voltage conversion circuit 135.

The coarse current generation circuit 131 may generate the coarse ramp current for the single ramp period based on first to $K^{th}$ coarse control signals S<1:K>.

The fine current generation circuit 133 may generate the fine ramp current for the single ramp period based on first to $N^{th}$ fine control signals SCK<1:N>.

The current-to-voltage conversion circuit 135 may generate the ramp current VRAMP corresponding to the resultant current for the single ramp period.

Figure 4:
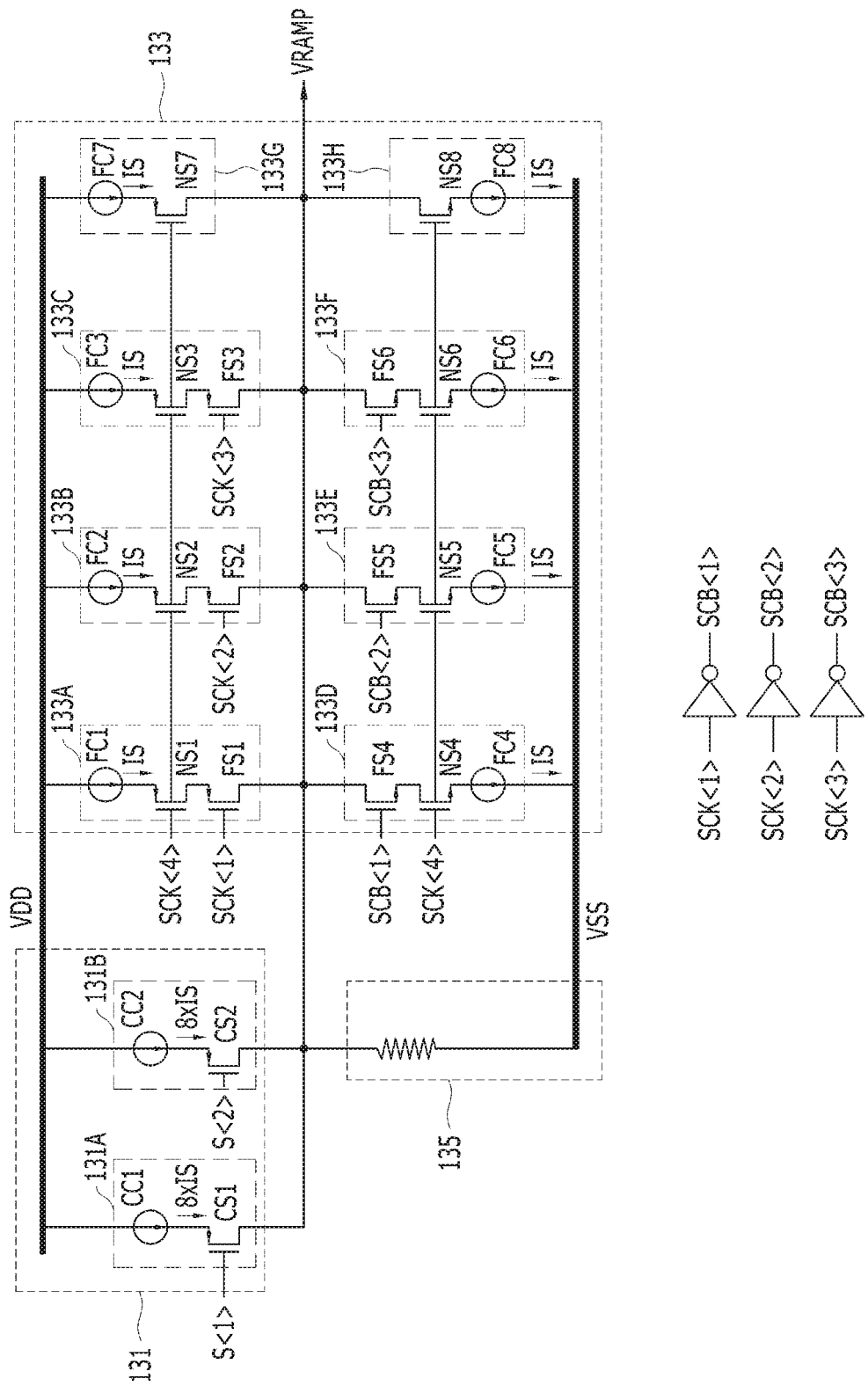
FIG. 4 is a circuit diagram illustrating a ramp voltage generator in accordance with an embodiment of the present invention.

FIG. 4 is a circuit diagram illustrating a ramp voltage generator in accordance with an embodiment of the present invention, for example, the coarse current generation circuit 131, the fine current generation circuit 133 and the current-voltage conversion circuit 135 shown in FIG. 3. By way of example, it is described that first and second coarse control signals S<1:2> and first to fourth fine control signals SCK<1:4> are inputted.

Referring to FIG. 4, the coarse current generation circuit 131 may include first and second coarse current cells 131A and 131B. The first and second coarse current cells 131A and 131B may be coupled in parallel between a supply terminal of a power source voltage (i.e., a high voltage) VDD and an output terminal of the ramp voltage VRAMP.

The first coarse current cell 131A may source a coarse unit current 8xIS corresponding to the coarse level to the output terminal of the ramp voltage VRAMP based on the first coarse control signal S<1>. For example, the first coarse current cell may include a first coarse current source CC1 and a first coarse switching element CS1. The first coarse current source CC1 may be coupled between the supply terminal of the power source voltage VDD and the first coarse switching element CS1, and generate the coarse unit current 8xIS. The first coarse switching element CS1 may be disposed between the first coarse current source CC1 and the output terminal of the ramp voltage VRAMP, and selectively couple the first coarse current source CC1 with the output terminal of the ramp voltage VRAMP based on the first coarse control signal S<1>. Hereinafter, the coarse unit current 8xIS, which is sourced from the first coarse current cell 131A to the output terminal of the ramp voltage VRAMP, is referred to as a "first coarse unit current".

The second coarse current cell 131B may have substantially the same structure as the first coarse current cell 131A, detailed descriptions thereof are omitted, but the second coarse current cell 131B may operate based on the second coarse control signal S<2>. Hereinafter, the coarse unit current 8xIS, which is sourced from the second coarse current cell 131B to the output terminal of the ramp voltage VRAMP, is referred to as a "second coarse unit current".

The coarse ramp current may correspond to a resultant current of the first and second coarse unit currents which are selectively generated from the first and second coarse current cells for the single ramp period.

The fine current generation circuit 133 may include first to sixth fine current cells 133A to 133F and first and second fine reference cells 133G and 133F.

The first to third fine current cells 133A to 133C and the first fine reference cell 133G may be coupled in parallel between the supply terminal of the power source voltage VDD and the output terminal of the ramp voltage VRAMP. The fourth to sixth fine current cells 133D to 133F and the second fine reference cell 133H may be coupled in parallel between the output terminal of the ramp voltage VRAMP and a supply terminal of a ground voltage (i.e., a low voltage) VSS.

The first fine current cell 133A may source a fine unit current IS corresponding to the fine level to the output terminal of the ramp voltage VRAMP based on an enable signal SCK<4> and the first fine control signal SCK<1>. For example, the first fine current cell 133A may include a first fine current source FC1, a first enable switching element NS1, and a first fine switching element FS1. The first fine current source FC1 may be coupled between the supply terminal of the power source voltage VDD and the first enable switching element NS1, and generate the fine unit current IS. The first enable switching element NS1 may be coupled between the first fine current source FC1 and the first fine switching element FS1, and selectively couple the first fine current source FC1 with the first fine switching element FS1 based on the enable signal SCK<4>. The first fine switching element FS1 may be coupled between the first fine current source FC1 and the output terminal of the ramp voltage VRAMP, and selectively couple the first fine current source FC1 with the output terminal of the ramp voltage VRAMP based on the first fine control signal SCK<1>. Hereinafter, the fine unit current IS, which is sourced from the first fine current cell 133A to the output terminal of the ramp voltage VRAMP, is referred to as a "first fine unit current".

The second and third fine current cells 133B and 133C have the same structure as the first fine current cell 133A, but the second and third fine current cells 133B and 133C may operate based on the second and third fine control signals SCK<2:3>, respectively. Hereinafter, the fine unit current IS, which is sourced from the second fine current cell 133B to the output terminal of the ramp voltage VRAMP, is referred to as a "second fine unit current", and the fine unit current IS, which is sourced from the third fine current 133C cell to the output terminal of the ramp voltage VRAMP, is referred to as a "third fine unit current".

The first fine reference cell 133G may source the fine unit current IS corresponding to the fine level to the output terminal of the ramp voltage VRAMP based on the enable signal SCK<4>. For example, the first fine reference cell may include a first reference current source FC7 and a seventh enable switching element NS7. The first reference current source FC7 may be coupled between the supply terminal of the power source voltage VDD and the seventh enable switching element NS7, and generate the fine unit current IS. The seventh enable switching element NS7 may be coupled between the first reference current source FC7 and the output terminal of the ramp voltage VRAMP, and selectively couple the first reference current source FC7 with the output terminal of the ramp voltage VRAMP based on the enable signal SCK<4>. Hereinafter, the fine unit current IS, which is sourced from the first fine reference cell FC7 to the output terminal of the ramp voltage VRAMP, is referred to as a "fourth fine unit current".

The second fine reference cell 133H may sink the fine unit current IS corresponding to the fine level from the output terminal of the ramp voltage VRAMP based on the enable signal SCK<4>. For example, the second fine reference cell 133H may include a second reference current source FC8 and an eighth enable switching element NS8. The second reference current source FC8 may be coupled between the supply terminal of the ground voltage VSS and the eighth enable switching element NS8, and generate the fine unit current IS. The eighth enable switching element NS8 may be coupled between the second reference current source FC8 and the output terminal of the ramp voltage VRAMP, and selectively couple the second reference current source FC8 with the output terminal of the ramp voltage VRAMP based on the enable signal SCK<4>. Hereinafter, the fine unit current IS, which sinks from the output terminal of the ramp voltage VRAMP through the second fine reference cell 133H, is referred to as a "fifth fine unit current".

The fourth fine current cell 133D may sink the fine unit current IS corresponding to the fine level from the output terminal of the ramp voltage VRAMP based on the enable signal SCK<4> and a fourth fine control signal SCB<1>. For example, the fourth fine current cell 133D may include a fourth fine current source FC4, a fourth enable switching element NS4, and a fourth fine switching element FS4. The fourth fine current source FC4 may be coupled between the fourth enable switching element NS4 and the supply terminal of the ground voltage VSS, and generate the fine unit current IS. The fourth enable switching element NS4 may be coupled between the fourth fine current source FC4 and the fourth fine switching element FS4, and selectively couple the fourth fine current source FC4 with the fourth fine switching element FS4 based on the enable signal SCK<4>. The fourth fine switching element FS4 may be coupled between the fourth enable switching element NS4 and the output terminal of the ramp voltage VRAMP, and selectively couple the fourth enable switching element NS4 with the output terminal of the ramp voltage VRAMP based on the fourth fine control signal SCB<1>. Hereinafter, the fine unit current IS, which sinks from the output terminal of the ramp voltage VRAMP through the fourth fine current cell 133D, is referred to as a "sixth fine unit current".

The fifth and sixth fine current cells 133E and 133F have the same structure as the fourth fine current cell 133D, but the fifth and sixth fine current cells 133E and 133F may operate based on fifth and sixth fine control signals SCB<2:3>, respectively. Hereinafter, the fine unit current IS, which sinks from the output terminal of the ramp voltage VRAMP through the fifth fine current cell 133E, is referred to as a "seventh fine unit current", and the fine unit current IS, which sinks from the output terminal of the ramp voltage VRAMP through the sixth fine current cell 133F, is referred to as an "eighth fine unit current".

Although it is described as an example of the present invention that the fine current generation circuit 133 sources or provides the first to fourth fine unit currents and sinks the fifth to eighth fine unit currents, the present invention is not limited to this arrangement; other suitable combinations of the first to eighth fine unit currents may be sourced or sink in accordance with embodiments of the invention.

The current-to-voltage conversion circuit 135 may be coupled between the output terminal of the ramp voltage VRAMP and the supply terminal of the ground voltage VSS. For example, the current-voltage conversion circuit 135 may include a load such as a resistor or other suitable structure that provides appropriate resistance.

An operation of the image sensing device 100 having the aforementioned structure in accordance with an embodiment of the present invention is described.

The pixel array 100 may output the first to $Y^{th}$ pixel signals VPX<1:Y> from the pixels arranged in each of the rows for each single row period.

The ramp voltage generator 130 may repeatedly generate the ramp voltage VRAMP for each single ramp period corresponding to the single row period. The ramp voltage generator 130 may generate the ramp voltage VRAMP for the single row period based on the resultant current of the coarse ramp current adjusted to the coarse level and the fine ramp current adjusted to the fine level.

The ADC 120 may generate the first to $Y^{th}$ image signals DOUT<1:Y> corresponding to the first to $Y^{th}$ pixel signals VPX<1:Y> based on the ramp voltage VRAMP.

Figure 5:
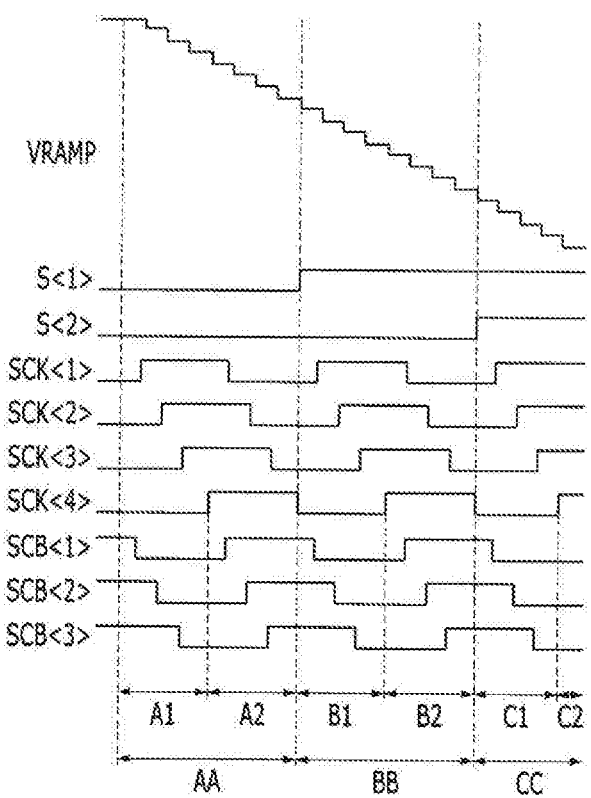
FIG. 5 is a timing diagram illustrating an operation of an image sensing device in accordance with an embodiment of the present invention.

FIG. 5 is a timing diagram illustrating an operation of a ramp voltage generator in accordance with an embodiment of the present invention, for example, the ramp voltage generator 130 shown in FIG. 1.

Referring to FIG. 5, for an initial ramp period AA of the single ramp period, the first and second coarse control signals S<1:2> may have logic low levels. Accordingly, the coarse current generation circuit 131 may simultaneously provide the first and second coarse unit currents to the output terminal of the ramp voltage VRAMP for the initial ramp period AA.

In addition, the enable signal SCK<4> may have a logic low level for a first ramp period A1 of the initial ramp period AA, and the enable signal SCK<4> may have a logic high level for a second ramp period A2, which follows the first ramp period A1, of the initial ramp period AA. For the first ramp period A1 of the initial ramp period AA, the first to third fine control signals SCK<1:3> may sequentially transition from the logic low levels to the logic high levels. The first fine control signal SCK<1> may include a signal that toggles with a cycle corresponding to the initial ramp period AA. The second fine control signal SCK<2> may include a signal that shifts the first fine control signal SCK<1> by a predetermined period in consideration of the fine level. The third fine control signal SCK<3> may include a signal that shifts the second fine control signal SCK<2> by the predetermined period. Accordingly, for the first ramp period A1 of the initial ramp period AA, the fine current generation circuit 133 may simultaneously source the first to fourth fine unit currents to the output terminal of the ramp voltage VRAMP, and then sequentially block the sourced first to fourth fine unit currents. For the second ramp period A2 of the initial ramp period AA, the fourth to sixth fine control signals SCB<1:3> may sequentially transition from the logic low levels to the logic high levels. The fourth to sixth fine control signals SCB<1:3> may include inverted signals of the first to third fine control signals SCK<1:3>, respectively. Accordingly, the fine current generation circuit 133 may sequentially sink the fifth to eighth fine unit currents from the output terminal of the ramp voltage VRAMP for the second ramp period A2 of the initial ramp period AA.

For a medium ramp period BB of the single ramp period, the first coarse control signal S<1> may have the logic high level, and the second coarse control signal S<2> may have the logic low level. Accordingly, the coarse current generation circuit 131 may block the first coarse unit current and source the second coarse unit current to the output terminal of the ramp voltage VRAMP for the medium ramp period BB. In addition, the enable signal SCK<4> may have the logic low level for a first ramp period B1 of the medium ramp period BB, and the enable signal SCK<4> may have the logic high level for a second ramp period B2, which follows the first ramp period B1, of the medium ramp period BB. For the first ramp period B1 of the medium ramp period BB, the first to third fine control signals SCK<1:3> may sequentially transition from the logic low levels to the logic high levels. Accordingly, the fine current generation circuit 133 may simultaneously source the first to fourth fine unit currents to the output terminal of the ramp voltage VRAMP, and then sequentially block the sourced first to fourth fine unit currents for the first ramp period B1 of the medium ramp period BB. For the second ramp period B2 of the medium ramp period BB, the fourth to sixth fine control signals SCB<1:3> may sequentially transition from the logic low levels to the logic high levels. Accordingly, the fine current generation circuit 133 may sequentially sink the fifth to eighth fine unit currents from the output terminal of the ramp voltage VRAMP for the second ramp period B2 of the medium ramp period BB.

For a last ramp period CC of the single ramp period, the first and second coarse control signals S<1:2> may have the logic high levels. Accordingly, the coarse current generation circuit 131 may block the first and second coarse unit currents which are sourced to the output terminal of the ramp voltage VRAMP for the last ramp period CC. In addition, the enable signal SCK<4> may have the logic low level for a first ramp period C1 of the last ramp period CC, and the enable signal SCK<4> may have the logic high level for a second ramp period C2, which follows the first ramp period C1, of the last ramp period CC. For the first ramp period C1 of the last ramp period CC, the first to third fine control signals SCK<1:3>may sequentially transition from the logic low levels to the logic high levels. Accordingly, the fine current generation circuit 133 may simultaneously source the first to fourth fine unit currents to the output terminal of the ramp voltage VRAMP, and then sequentially block the sourced first to fourth fine unit currents for the first ramp period C1 of the last ramp period CC. For the second ramp period C2 of the last ramp period CC, the fourth to sixth fine control signals SCB<1:3> may sequentially transition from the logic low levels to the logic high levels. Accordingly, the fine current generation circuit 133 may sequentially sink the fifth to eighth fine unit currents from the output terminal of the ramp voltage VRAMP for the second ramp period C2 of the last ramp period CC.

To sum up, the first and second coarse unit currents which are sourced for the single ramp period may be sequentially blocked for each initial ramp period AA, medium ramp period BB and last ramp period CC. The first to fourth fine unit currents may be repeatedly sourced and blocked for the initial ramp period AA, the medium ramp period BB and the last ramp period CC. The fifth to eighth fine unit currents may repeatedly sink for the initial ramp period AA, the medium ramp period BB and the last ramp period CC.

Therefore, the ramp voltage generator 130 may generate the ramp voltage VRAMP that continuously decreases by the fine level for the single ramp period.

As is apparent from the above description, in an image sensing device and method of driving the same in accordance with embodiments, a circuit structure of the ramp voltage generator advantageously may be optimized as a ramp voltage is designed to be generated using a resultant current of a coarse unit current and a fine unit current.

In accordance with embodiments of the present invention, as the circuit structure of the ramp voltage generator is optimized, design of the ramp voltage generator may be simplified, and an occupying area of the ramp voltage generator may be minimized.

While the present invention has been described with respect to specific embodiments, the embodiments are not intended to be restrictive, but rather descriptive. Further, it is noted that the present invention may be achieved in various ways through substitution, change, and modification, as would be apparent to those skilled in the art in light of the present disclosure, without departing from the spirit and/or scope of the present invention as defined by the following claims.

For example, dispositions and types of the logic gates and transistors described in the aforementioned embodiments may be implemented differently based on the polarity of the inputted signal.

What is claimed is:

1. An image sensing device, comprising:
a coarse current generation circuit suitable for generating a coarse ramp current adjusted to a coarse level for a single ramp period, based on one or more coarse control signals;
a fine current generation circuit suitable for generating a fine ramp current adjusted to a fine level for the single ramp period, based on a plurality of fine control signals, wherein a second fine control signal of the plurality of fine control signals includes a signal that shifts a first fine control signal of the plurality of fine control signals by a predetermined period; and
a current-to-voltage conversion circuit suitable for generating a ramp voltage corresponding to a resultant current of the coarse ramp current and the fine ramp current for the single ramp period.

2. The image sensing device of claim 1,
wherein the coarse current generation circuit is coupled between a supply terminal of a high voltage and an output terminal of the ramp voltage,
wherein the fine current generation circuit is coupled between at least one of the supply terminal of the high voltage and a supply terminal of a low voltage and the output terminal of the ramp voltage,
wherein the current-to-voltage conversion circuit is coupled between the output terminal of the ramp voltage and the supply terminal of the low voltage.

3. The image sensing device of claim 1,
wherein the coarse ramp current corresponds to a plurality of coarse unit currents which are sourced to the output terminal of the ramp voltage for the single ramp period,
wherein the plurality of coarse unit currents are simultaneously sourced to the output terminal of the ramp voltage, and then are sequentially blocked for the single ramp period.

4. The image sensing device of claim 1,
wherein the fine ramp current corresponds to a plurality of first fine unit currents which are sourced to the output terminal of the ramp voltage for a first ramp period of the single ramp period and a plurality of second fine unit currents which sink from the output terminal of the ramp voltage for a second ramp period of the single ramp period,
wherein the plurality of first fine unit currents are simultaneously sourced to the output terminal of the ramp voltage, and then are sequentially blocked for the first ramp period,
wherein the plurality of second fine unit currents sequentially sink from the output terminal of the ramp voltage for the second ramp period.

5. The image sensing device of claim 4, wherein the first and second ramp periods are repeated two or more times for the single ramp period.

6. An image sensing device, comprising:
a plurality of first current cells coupled between a supply terminal of a high voltage and an output terminal of a ramp voltage, and suitable for sourcing coarse unit currents to the output terminal of the ramp voltage based on an enable signal and a plurality of coarse control signals for a single ramp period;
a plurality of second current cells coupled between the supply terminal of the high voltage and the output terminal of the ramp voltage, and suitable for sourcing fine unit currents to the output terminal of the ramp voltage based on the enable signal and a plurality of fine control signals for the single ramp period, wherein a second fine control signal of the plurality of fine control signals includes a signal that shifts a first fine control signal of the plurality of fine control signals by a predetermined period; and
a load coupled between the output terminal of the ramp voltage and a supply terminal of a low voltage.

7. The image sensing device of claim 6, wherein each of the first current cells includes:
a first current source suitable for generating the coarse unit currents; and
a first switch suitable for switching between the first current source and the output terminal of the ramp voltage based on a corresponding coarse control signal among the plurality of coarse control signals.

8. The image sensing device of claim 6, wherein each of the second current cells includes:
a second current source suitable for generating the fine unit currents; and
a second switch suitable for switching between the second current source and the output terminal of the ramp voltage based on a corresponding fine control signal among the plurality of fine control signals and the enable signal.

9. The image sensing device of claim 6, further comprising:
a plurality of third current cells coupled between the output terminal of the ramp voltage and the supply terminal of the low voltage, and suitable for sinking the fine unit currents from the output terminal of the ramp voltage based on the enable signal and a plurality of third control signals for the single ramp period.

10. The image sensing device of claim 9, wherein each of the third current cells includes:
a third current source suitable for generating the fine unit currents; and
a third switch suitable for switching between the third current source and the output terminal of the ramp voltage based on a corresponding third control signal among the plurality of third control signals and the enable signal.

11. The image sensing device of claim 9, further comprising:
a first reference cell coupled between the supply terminal of the high voltage and the output terminal of the ramp voltage, and suitable for sourcing the fine unit currents to the output terminal of the ramp voltage based on the enable signal for a first ramp period of the single ramp period; and
a second reference cell coupled between the output terminal of the ramp voltage and the supply terminal of the low voltage, and suitable for sinking the fine unit currents from the output terminal of the ramp voltage based on the enable signal for a second ramp period of the single ramp period.

12. The image sensing device of claim 11, wherein the first and second ramp periods are repeated two or more times for the single ramp period.

13. The image sensing device of claim 6, wherein the load includes a resistor.

14. An image sensing device, comprising:
a pixel array suitable for generating pixel signals;
an analog-to-digital converter suitable for generating image signals corresponding to the pixel signals based on a ramp voltage; and
a ramp voltage generator suitable for generating the ramp voltage based on a resultant current of a coarse ramp current adjusted to a coarse level and a fine ramp current adjusted to a fine level for a single ramp period,
the ramp voltage generator includes:
a fine current generation circuit suitable for generating the fine ramp current based on a plurality of fine control signals, wherein a second fine control signal of the plurality of fine control signals includes a signal that shifts a first fine control signal of the plurality of fine control signals by a predetermined period.

15. The image sensing device of claim 14, wherein the ramp voltage generator further includes:
a coarse current generation circuit suitable for generating the coarse ramp current for the single ramp period; and
a current-to-voltage conversion circuit suitable for generating the ramp voltage corresponding to the resultant current for the single ramp period.

16. The image sensing device of claim 15, wherein the coarse current generation circuit includes a plurality of first current cells coupled between a supply terminal of a high voltage and an output terminal of the ramp voltage, and the plurality of first current cells source coarse unit currents to the output terminal of the ramp voltage based on an enable signal and a plurality of coarse control signals for the single ramp period.

17. The image sensing device of claim 14, wherein the fine current generation circuit includes a plurality of second current cells coupled between a supply terminal of a high voltage and an output terminal of the ramp voltage, and the plurality of second current cells source first fine unit currents to the output terminal of the ramp voltage based on an enable signal and the plurality of fine control signals for the single ramp period.

18. The image sensing device of claim 17, wherein the fine current generation circuit further includes a plurality of third current cells coupled between the output terminal of the ramp voltage and a supply terminal of a low voltage, and the plurality of third current cells sink second fine unit currents from the output terminal of the ramp voltage based on the enable signal and a plurality of control signals for the single ramp period.

19. The image sensing device of claim 18, wherein the fine current generation circuit further includes:
- a first reference cell coupled between the supply terminal of the high voltage and the output terminal of the ramp voltage, and suitable for sourcing the fine unit currents to the output terminal of the ramp voltage based on the enable signal for a first ramp period of the single ramp period; and
- a second reference cell coupled between the output terminal of the ramp voltage and the supply terminal of the low voltage, and suitable for sinking the second fine unit currents from the output terminal of the ramp voltage based on the enable signal for a second ramp period of the single ramp period.

20. The image sensing device of claim 19, wherein the first and second ramp periods are repeated two or more times for the single ramp period.

* * * * *